US009159480B2

(12) United States Patent
Bauer et al.

(10) Patent No.: US 9,159,480 B2
(45) Date of Patent: Oct. 13, 2015

(54) METHOD FOR ACTUATING AN ELECTROMAGNETIC LOAD AND A CORRESPONDING CIRCUIT

(75) Inventors: Patrick Bauer, Stuttgart (DE); Mehmet Oencel, Boennigheim (DE); Ralph Bauer, Esslingen (DE); Bernd Schelling, Stuttgart (DE); Thomas Holst, Stuttgart (DE); Georg Hoegele, Muenchingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 657 days.

(21) Appl. No.: 12/887,888

(22) Filed: Sep. 22, 2010

(65) Prior Publication Data

US 2011/0075314 A1 Mar. 31, 2011

(51) Int. Cl.

| | |
|---|---|
| ***G11C 13/02*** | (2006.01) |
| ***H01F 7/18*** | (2006.01) |
| ***F02M 51/00*** | (2006.01) |
| ***H01H 47/32*** | (2006.01) |
| ***F02D 41/20*** | (2006.01) |
| *H01H 47/00* | (2006.01) |

(52) U.S. Cl.

CPC *H01F 7/18* (2013.01); *F02D 41/20* (2013.01); *F02M 51/00* (2013.01); *H01H 47/32* (2013.01); *F02D 2041/2058* (2013.01); *H01H 47/00* (2013.01)

(58) Field of Classification Search

CPC ........... H03K 3/45; H03K 3/49; H03K 19/16; H02K 3/51; H02K 19/16; H02K 23/76; H01H 47/32; H01H 47/00; H03F 3/45; H03F 3/38; H03F 1/52; F02M 51/00; G01R 19/00

USPC ................. 361/159, 155, 156, 153, 152, 143; 123/490; 251/129.15; 318/126

See application file for complete search history.

(56) References Cited

U.S. PATENT DOCUMENTS

| | | | | |
|---|---|---|---|---|
| 4,639,822 | A * | 1/1987 | Kubach et al. | 361/155 |
| 4,733,326 | A * | 3/1988 | Harsch et al. | 361/159 |
| 5,070,306 | A * | 12/1991 | Okamoto | 330/253 |
| 5,592,921 | A * | 1/1997 | Rehbichler | 123/490 |
| 5,835,330 | A | 11/1998 | Kirschner et al. | |
| 7,259,618 | B2 * | 8/2007 | Hand et al. | 330/10 |

FOREIGN PATENT DOCUMENTS

| | | |
|---|---|---|
| DE | 43 41 797 | 6/1995 |
| EP | 0 764 238 | 4/1999 |

* cited by examiner

*Primary Examiner* — Rexford Barnie
*Assistant Examiner* — Jagdeep Dhillon
(74) *Attorney, Agent, or Firm* — Kenyon & Kenyon LLP

(57) ABSTRACT

A method is proposed for actuating an electromagnetic load (3) which can be switched between at least two switching states, particularly a magnetic valve, wherein switching between a first and a second of the switching states takes place as a result of a current flowing through the load (3) by means of applying an electrical voltage to said load (3). Provision is thereby made for the voltage to be clocked upon application thereof to said load (3) if due to the applied voltage the switching process would occur without clocking outside of a current ramp-up. The invention furthermore relates to an electrical circuit for actuating an electromagnetic load (3).

2 Claims, 2 Drawing Sheets

102798

METHOD FOR ACTUATING AN ELECTROMAGNETIC LOAD AND A CORRESPONDING CIRCUIT

This application claims benefit of Serial No. 10 2009 044 953.1, filed 24 Sep. 2009 in Germany and which application is incorporated herein by reference. To the extent appropriate, a claim of priority is made to the above disclosed application.

BACKGROUND

The method relates to a method for actuating an electromagnetic load which can be switched between at least two switching states, in particular a magnetic valve, wherein switching between a first and a second of the switching states takes place as a result of a current flowing through the load by means of applying an electrical voltage to said load.

Methods and devices for actuating an electromagnetic load which can be switched between at least two switching states, in particular a magnetic valve, are known from the German patent publication DE 4 341 797 A1 as well as from the European patent publication EP 0 764 238 B1. A voltage is applied to an electromagnetic load in the methods and devices described there. The current flowing through the load increases on account of the applied voltage. This first increase in current, referred to below as current ramp-up, continues up until the current flowing through the electrical load achieves a predetermined threshold value. The current ramp-up ends upon achieving the threshold value, and the current flowing through said load is controlled to a nominal value via an open-loop or closed-loop control device, preferably by clocking the voltage—ie. by periodically applying and not applying said voltage. A switching of the electromagnetic load from a first to a second of the switching states always takes place after said current ramp-up. When switching between states, magnetic parts or parts connected to them, as, for example, an armature or a valve needle, move on account of the current flowing through said load from on position to another. The positions correspond, for example, to end positions, particularly to a rest or operating position. The movement of the magnetic parts causes a characteristic change in the profile of the current, provided a magnetic circuit of the electromagnetic load interacting with said parts has not gone to saturation. The current profile during the current control is evaluated to determine the point in time of the switching process, and the switching point in time of the electromagnetic load is determined with the help of the temporal profile of the current. The electromagnetic load actuated in this manner can, for example, be a magnetic valve, which is primarily used to control the injection of fuel, for example, into an internal combustion engine. The point in time of the switching process, whereat the moving, magnetic parts of the electromagnetic load achieve in each case one of their two end positions, is particularly of interest for the exact metering of the smallest injected quantities.

The known systems take the approach—as previously described—that the current is clocked after the current ramp-up and is thus controlled to a nominal value. The switching process of the electromagnetic load always occurs during this nominal value control after the current ramp-up. For this reason, a change in the current profile, which is not based on the control but on the switching of the electromagnetic load is always evaluated in this phase as the point in time of the switching process. Following said switching process, the voltage applied to the electromagnetic load continues to be clocked so long as the switching state of the electromagnetic load is to be maintained. In this method, it is always necessary to ensure that the switching of the electromagnetic load does not already occur during the current ramp-up but particularly in the phase of the current control. A circuit for implementing the method must therefore likewise be laid out accordingly. Method and circuit must consequently be adapted to the prevailing conditions, as, for example, applied voltage and parameters of the electromagnetic load, which is why they are not universally applicable.

SUMMARY

The method with the features stated in claim 1 has in contrast the advantage of the switching of the electromagnetic load occurring independently of the applied voltage or parameters of the load, said switching process always taking place during the current ramp-up. In so doing, the voltage is clocked if need be upon, respectively from, the application of the voltage to the load if due to the applied voltage the switching process would occur without clocking outside of the current ramp-up. The method is therefore independent of the amount of the applied voltage and can hence be used, for example, for 12V as well as 24V on-board electrical systems of vehicles. Said method can likewise be applied to different electromagnetic loads. As described above, the voltage is clocked when said voltage is applied to the load if due to the applied voltage the switching of the load would occur without clocking outside of the current ramp-up. In contrast to the technical field, the voltage is then either clocked when said voltage is applied to the load and consequently already during the current ramp-up or is not clocked prior to switching the electromagnetic load. The current after the switching process can be controlled independently of the current ramp-up, for example by clocking, to a certain value, which is required to hold said electromagnetic load in its switching state. Said method can be carried out independently of the applied voltage and independently of said electromagnetic load because according to the invention the switching of said electromagnetic load always occurs during the current ramp-up. The use of the method is therefore possible independent of the previously mentioned prevailing conditions, whereby a standardization of processes can take place which contributes to the overall reduction of costs. As a result of clocking during the current ramp-up, it is ensured that the magnetic circuit of said electromagnetic load does not go to saturation prior to said switching process. Were the magnetic circuit to go to saturation before said switching process, the point in time of said switching process could not be determined on the basis of the change in the current profile.

Provision is made in a modification to the invention for the voltage to be clocked with the aid of a switching means. A current control can be implemented by clocking the voltage with the aid of a switching means which, for example, is connected in series with the electromagnetic load. Due to the inductive characteristics of said electromagnetic load, the current flowing through said load does not change precipitously if the switch is opened or closed. The current can thus be controlled in a certain range by the periodic opening and closing of the switching means. A current control of this type can be necessary if due to the applied voltage the switching of said electromagnetic load would occur without clocking outside of the current ramp-up. As a result of clocking the voltage upon application of said voltage to the load, it is possible for the switching process to always occur within the framework of the current ramp-up.

Provision is made in a modification to the invention for the switching of the load to be ascertained by evaluating a signal corresponding to a current profile. The switching of the electromagnetic load, which occurs within the current ramp-up, causes a change of the current profile in the load during the clocked as well as the unclocked current ramp-up. Said switching of the load can therefore be ascertained by evaluating a signal corresponding to the current profile. Moreover, evaluating the signal corresponding to the current profile can contribute to a current control during the current ramp-up and/or to a holding current control after said current ramp-up. Clocking during said current ramp-up and the evaluation of the current profile have to be adapted to each other such that a change in the current profile, which is caused by the switching process, can be reliably evaluated. Clocking after said switching process, which, for example, contributes to a holding current control, occurs regardless of whether the voltage was already clocked upon application of said voltage or whether said voltage was not clocked prior to the switching of the first to the second of the switching states of the electromagnetic load.

Provision is made in a modification to the invention for the signal corresponding to the current profile to be determined with the aid of a measurement resistor. With the aid of a measurement resistor connected, for example, in series with the electromagnetic load, a voltage dropping across the measurement resistor can be determined with an evaluation means. The current flowing through the load and the profile thereof can thus be determined via the direct correlation between current and voltage.

Provision is made in a modification to the invention for the signal corresponding to the current profile to be amplified with the aid of an amplifier, in particular a differential amplifier. An amplification of the signal corresponding to the current profile can be used to standardize said signal to a certain value if this is necessary for a further processing and/or evaluation. In addition, the amplifier can be configured such that it is optimized for the expected current profile; thus enabling a very exact determination of the current to result.

Provision is made in a modification to the invention for the signal corresponding to the current profile to be converted into a digital signal. It may be necessary for the further evaluation of said signal corresponding to the current profile for said signal corresponding to the current profile to be present as a digital signal. The conversion takes place for this reason.

Provision is made in a modification to the invention for the signal corresponding to the current profile to be evaluated by a control and/or regulating device. A control and/or regulating device, which analogously and/or digitally evaluates the signal corresponding to the current profile in unamplified or amplified form can, for example, be used to detect a duration of injection of the magnetic valve and to control said duration of injection in an open, respectively closed, loop. It is therefore possible to exactly detect the switching of the electromagnetic load with the help of the signal corresponding to the current profile and as a result to exactly determine a switching state of the electromagnetic load.

The invention further relates to an electrical circuit, particularly for carrying out the method according to one or a plurality of the preceding claims, for actuating an electromagnetic load which can be switched between at least two switching states, particularly a magnetic valve, wherein electrical voltage can be applied to the load by way of a switching means in order to switch between a first and a second of the switching states, whereby electrical current flows through said load. The electrical circuit is thereby characterized in that the switching means is provided to clock the voltage upon application of said voltage if due to the applied voltage the switching process would occur outside of a current ramp-up. By clocking the voltage upon application thereof to the electromagnetic load, said switching of the electromagnetic load shall occur during the current ramp-up. Moreover, it is likewise possible for the voltage not to be clocked during said current ramp-up if due to the applied voltage the switching process nevertheless takes place during said current ramp-up. The advantages mentioned in regard to the invention can be implemented by means of the switching process occurring within the current ramp-up.

Provision is made in a modification to the invention for a control and/or regulating device which acts on the switching means to be provided. It is possible on the one hand to apply voltage to the electromagnetic load by means of the control and/or regulating device which acts on said switching means and on the other hand to clock the voltage upon, respectively from, the application of said voltage.

BRIEF DESCRIPTION OF THE DRAWINGS

The invention is explained below with the aid of the embodiments depicted in the drawings without said embodiments representing a limitation to the invention. The following are shown.

DETAILED DESCRIPTION

Figure 1:
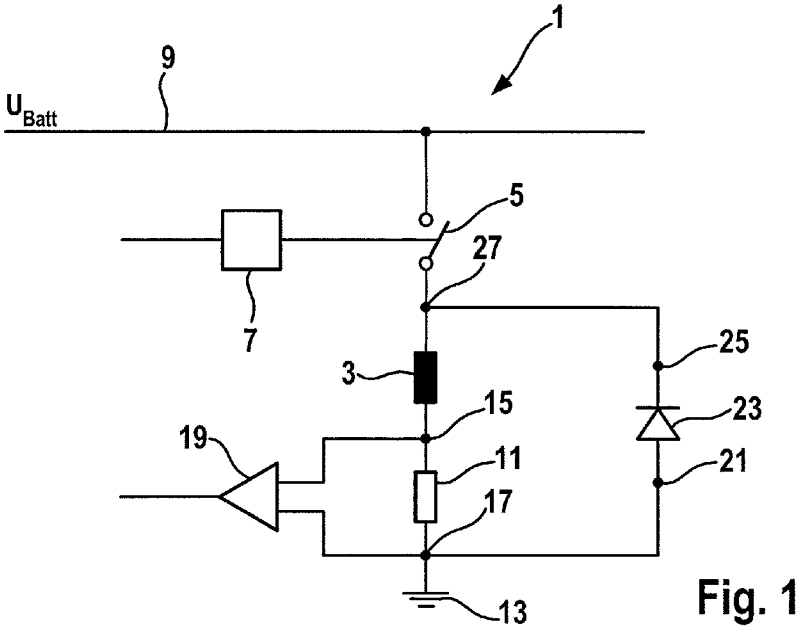
FIG. 1 is a schematic depiction of a circuit according to the invention.

A schematic depiction of a circuit 1, which is reduced to the essential components, can be seen in FIG. 1. An electromagnetic load 3, particularly a magnetic valve, is connected to a voltage supply unit 9, which provides a voltage $U_{Batt}$, via a switching means 5, for example, a transistor, which is actuated by an actuating device 7. The actuating device can be connected to a control and/or regulating device, which is not depicted here. The load 3 is connected across a measurement resistor 11 to a ground 13. Two terminals 15 and 17 of the measurement resistor 11 are connected to an evaluation means 19, for example an operational amplifier. In so doing, terminal 15 is associated with, respectively connected to, the load 3 and terminal 17 with, respectively to, the ground 13. In this way, a variable corresponding to the current flowing through said load 3, respectively a corresponding signal, can be determined. The signal corresponding to the current profile, which was determined in this way, can additionally be amplified and/or converted to a digital signal. Said signal can be evaluated with the aid of the control and/or regulating device. The ground 13 is connected by circuitry to an anode 21 of a diode 23. A cathode 25 of the diode 23 is connected to a junction point 27, which is provided between said electromagnetic load 3 and the switching means 5. Said diode 23 serves as a freewheeling diode. This arrangement consisting of an electromagnetic load 3, a measurement resistor 11 and a diode 23 represents a simple implementation of a freewheeling circuit.

If the switching means 5 is closed in the depicted circuit 1, a voltage is then present at the electromagnetic load 3 and at the measurement resistor 11. The signal corresponding to the current flowing through said load 3 and said measurement resistor 11 is determined via the evaluation means 19. Said signal is subsequently evaluated in amplified or unamplified form as an analog or digital signal by the control and/or regulating device. During a first time period, after said switching means 5 has been closed, the current flowing through said load 3 increases. In the method according to the invention, the switching of said load 3 always takes place in this time period of the current ramp-up. In addition, the voltage is clocked upon application of said voltage to the load 3 if due to the applied voltage the switching process would occur without clocking outside of the current ramp-up. The point in time of the switching process is ascertained by evaluating the signal corresponding to the current profile. If the closed switching means 5 is opened again, the current initially flows across the measurement resistor 11 and the diode 23 on account of the energy stored in said load 3. The current continues to flow in this manner until the energy is used up.

Figure 2:
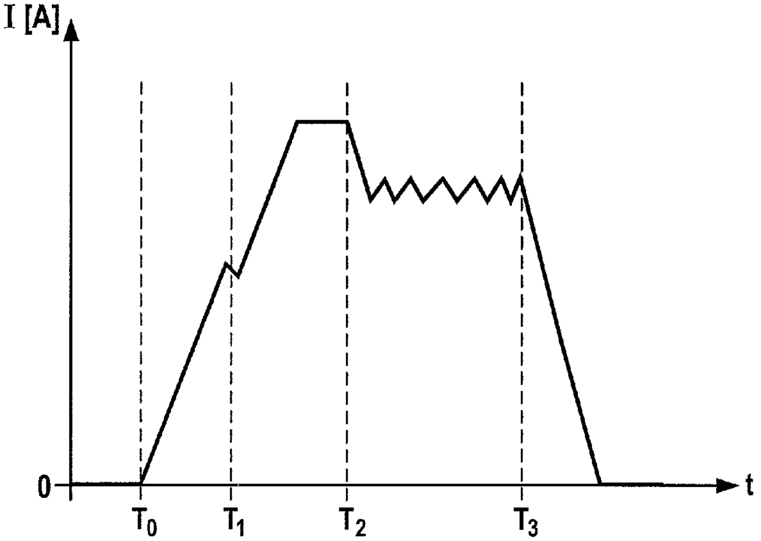
FIG. 2 is a current profile plotted versus time.

Reference is made to FIG. 2, wherein the profile of the current which flows through the electromagnetic load 3 is plotted versus time, to further explain the method. The reference numerals correspond to those used in FIG. 1 for the circuit 1. The case of the current not being clocked in the phase of the current ramp-up is depicted by way of example. It can be seen in FIG. 2 that no current flows through said electromagnetic load 3 up until a point in time $T_0$. Up until this point in time $T_0$, the switching means 5 is open. Said switching means 5 is closed by way of an actuating signal from the actuating device 7 at said point in time $T_0$. From this point on, voltage drops across said electromagnetic load 3 as well as across the measurement resistor 11. Because the current which flows through said electromagnetic load 3 cannot precipitously change, it increases from said point in time $T_0$. This increase is dependent on various factors and is depicted here linearly in simplified form. It would be likewise possible to clock the voltage upon application thereof to the load 3 in the event that this is necessary in order for the switching of said load 3 to occur during the current ramp-up. A drop in current around a point in time $T_1$ is characteristic for said switching of said electromagnetic load 3. By evaluating the signal corresponding to the current profile, the control and/or regulating device can ascertain the point in time of the switching process using this drop in current. After said switching of said electromagnetic load 3, the current continues to increase. Said switching of said electromagnetic load 3 always occurs during the current ramp-up in the method according to the invention. The switching means 5 can, as depicted here by way of example, be subsequently opened via another actuating signal from the actuating device 7 at a point in time $T_2$ so that said load 3 is no longer connected to the voltage supply unit 9. The current which flows through said electromagnetic load 3 and said measurement resistor 11 drops again as a result. The actuating circuit 7 can now, for example, be controlled via said control and/or regulating device such that said switching means 5 is again closed when a certain first current value is not met and are opened again when a certain second current value is exceeded. A current control can thus be implemented, in which a holding current for said electromagnetic load 3 is controlled in a certain range. Said switching means 5 is opened at a point in time $T_3$ via an actuating signal from said actuating device 7. Because thereafter said switching means is initially not closed again, the current drops back to 0 amperes.

The method can, as described above, likewise be implemented if the current, which flows through the electromagnetic load 3, is also clocked between the points in time $T_0$ and $T_2$, i.e. during the current ramp-up. Despite the clocking of the current, it is necessary that a change in the current profile due to the switching of said electromagnetic load 3 be ascertained. The clocking of the current during the current ramp-up is then used according to the invention if due to the applied voltage the switching process would occur without clocking outside of said current ramp-up.

Figure 3:
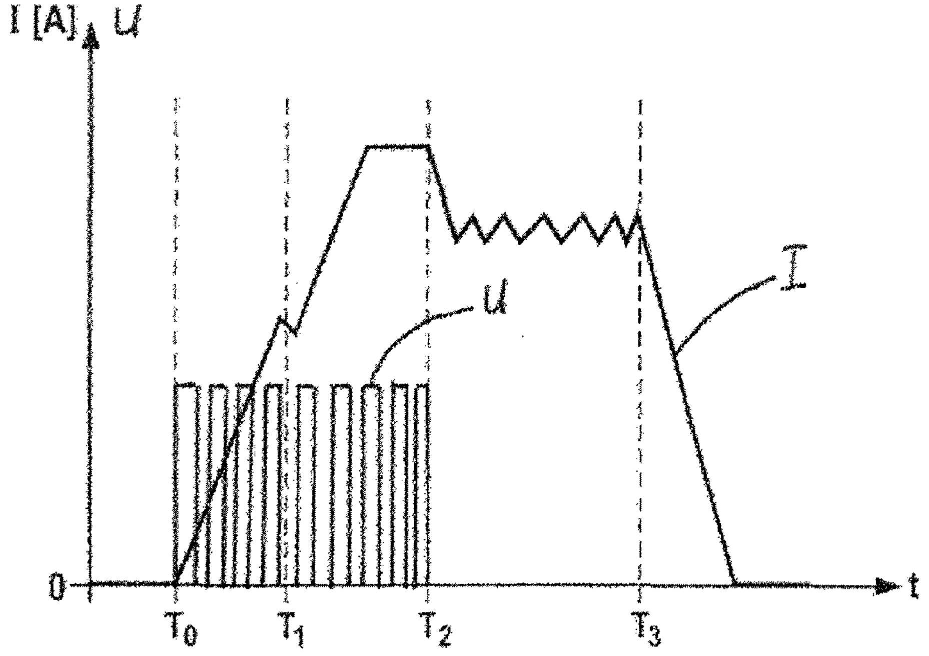
FIG. 3 is a schematic depiction of another embodiment option of the circuit according to the invention.

FIG. 3 shows a schematic depiction of a circuit 2, which represents another embodiment option of the circuit according to the invention. Elements, which correspond to the elements of FIG. 1, are labeled with the same reference numerals. In addition to the elements depicted in FIG. 1, provision is made for an additional switching means 29, for example a transistor, having an additional actuating device 31 connected by circuitry between the load 3 and the measurement resistor 11. Such a disposal of the load 3 between two switching means 5 and 29 can, for example, facilitate a quick interruption of the current flow by opening the additional switching means 29. When said additional switching means 29 is closed, a current control through the switching means 5 can occur by clocking the voltage, wherein the current can continue to flow across the diode 23—in terms of the freewheeling circuit—when said switching means 5 is open. Furthermore, the invention provides for another measurement resistor 33 between said measurement resistor 11 and the ground 13 as well as another evaluation means 35, which is connected in parallel with the additional measurement resistor 33. By having such a combination of the additional measurement resistor 33 and the additional evaluation means 35, a short circuit protection can, for example, be implemented, which, for example, protects said switching means 5 and 29 from damage in the event of a short circuit, e.g. a short circuit of the load 3. In so doing, said additional measurement resistor 33 and said additional evaluation means can be optimized for measuring a current to be expected in the event of a short circuit.

The invention claimed is:

1. A method for actuating an electromagnetic valve, the electromagnetic valve having at least two switching states, one of the switching states being an open state, wherein switching between the switching states is effected by an electrical current, and wherein timing of the switching can be controlled by controlling a ramp-up of the electrical current, the method comprising:

applying an electrical voltage to the electromagnetic valve causing the ramp-up of electrical current; and ensuring that the electromagnetic valve switches to the open state during the ramp-up of electrical current by clocking the electrical voltage if without clocking the electromagnetic valve would switch to the open state outside of the ramp-up, wherein a signal corresponding to a current profile is determined by a measurement resistor and amplified by a differential amplifier, and wherein the signal can be converted to a digital signal and evaluated by a control device, the control device being able to control the switching process.

2. A fuel injector comprising an electrical circuit capable of carrying out the method of claim 1, wherein the duration of fuel injection by the fuel injector can be controlled by the electrical circuit.

* * * * *